United States Patent [19]

VanIseghem

[11] Patent Number: 4,764,449
[45] Date of Patent: Aug. 16, 1988

[54] ADHERENT SANDBLAST PHOTORESIST LAMINATE

[75] Inventor: Lawrence C. VanIseghem, Duluth, Minn.

[73] Assignee: The Chromaline Corporation, Duluth, Minn.

[21] Appl. No.: 794,083

[22] Filed: Nov. 1, 1985

[51] Int. Cl.[4] .................... G03C 11/12; G03F 7/26; B24C 1/04; B44C 1/22
[52] U.S. Cl. .................... 430/162; 430/275; 430/258; 430/271; 51/310; 51/312
[58] Field of Search .......... 430/275, 258; 51/310, 51/312; 430/271, 162, 271 A

[56] References Cited

U.S. PATENT DOCUMENTS

| | | | |
|---|---|---|---|
| 2,822,271 | 2/1958 | Krieger | 96/75 |
| 3,156,585 | 11/1964 | Sinclair | 96/83 |
| 3,186,844 | 6/1965 | Alles et al. | 430/271 A |
| 3,469,982 | 9/1969 | Celeste | 96/35.1 |
| 3,519,463 | 7/1970 | Baum | 117/36.1 |
| 3,549,363 | 12/1970 | Collins et al. | 96/35.1 |
| 4,133,919 | 1/1979 | Parsons | 427/259 |
| 4,154,614 | 5/1979 | Tsunoda et al. | 96/75 |
| 4,199,358 | 4/1980 | Parsons | 430/304 |
| 4,233,395 | 11/1980 | Klüpfel et al. | 430/271 A |
| 4,297,428 | 10/1981 | Yamamoto | 430/169 |
| 4,330,611 | 5/1982 | Thomas et al. | 430/156 |
| 4,371,602 | 2/1983 | Iwasaki et al. | 430/175 |
| 4,388,388 | 6/1983 | Kornbau et al. | 430/258 |
| 4,430,416 | 2/1984 | Goto et al. | 430/258 X |
| 4,456,680 | 6/1984 | Nakamura et al. | 430/258 |
| 4,511,640 | 4/1985 | Liu | 430/157 |

OTHER PUBLICATIONS

Chem. Abst. Ca:97:118284b.
Chem. Abst. Ca:94:74752j.
Chem. Abst. Ca:93:177305z.
Chem. Abst. Ca:88:171562f.
Chem. Abst. Ca:88;201071q.
Chem. Abst. Ca:82:179726j.
Chem. Abst. Ca:86:18537r.
Chem. Abst. Ca:89:68607w.
Chem. Abst. Ca:40028e.
Chem. Abst. Ca:91:22083k.
Chem. Abst. Ca:96:77570a.
Chem. Abst. Ca:44227g.
Chem. Abst. Ca:98:207595s.
Ichimura, Kunihiro, "Preparation of Water-Soluble Photoresist Derived from Poly(vinyl Alcohol), J. Poly. Sci., vol. 20, 1982.
Ichimura, Kunihiro et al., "Preparation & Characteristics of Photocrosslinkable Poly(vinyl Alcohol)", J. Poly. Sci., vol. 20, 1982.

Primary Examiner—Paul R. Michl
Assistant Examiner—Cynthia Hamilton
Attorney, Agent, or Firm—Merchant, Gould, Smith, Edell, Welter & Schmidt

[57] ABSTRACT

A sandblast photoresist laminate article of manufacture comprising an adhesive layer, a membrane support layer, and a resist layer can be used in etching the surface of articles with a pattern which can be revealed by the resist layer. The resist laminate is usable in a variety of modes of etching such as exposing the resist with a pattern, developing the pattern, applying the developed resist to the object, and etching the pattern into the object. Further, the resist can be used by applying the unexposed sheet-like resist to an object, exposing the resist with a pattern, developing the pattern and etching the pattern into the object. Lastly, the resist laminate can be used by exposing the resist with a pattern, applying the exposed resist to an object, developing the pattern, and etching the pattern into the object. The resist compositions are typically water developable after exposure with actinic radiation.

7 Claims, 5 Drawing Sheets

ADHERENT SANDBLAST PHOTORESIST LAMINATE

FIELD OF THE INVENTION

The invention relates to an article of manufacture comprising an adherent sheet-like photoresist laminate which can be used to introduce a pattern into a surface using a particulate etchant such as a sandblast.

More particularly, the invention relates to a photoresist laminate which can be adherently applied to the surface of an object of virtually any shape or material, for the purpose of revealing or exposing in the surface of the object a pattern to be etched. The resist laminate contains a layer of a positive or a negative photoresist composition that can be exposed to light in a specific, desired pattern. The pattern can be developed and the surface of the object can be selectively revealed. By the action of an etchant, a pattern can then be created in the revealed surface.

BACKGROUND OF THE INVENTION

Over the years a great deal of interest has focused on the art of etching patterns into surfaces of objects. Such patterns can be decorative, informative, can be for the purpose of providing nonskid surface properties, can be for forming copper printed wiring board patterns, and can be useful in many other applications where a specific pattern is desired. Typically, in forming such patterns by etching, a liquid photoresist composition is applied in a thin film to an object's surface. The photoresist composition is commonly a nonaqueous solution or suspension of photo-sensitive compounds in a solvent. The liquid photoresist film is dried and can then be exposed to light in a desired image. The pattern is developed conventionally and the revealed surface is contacted with an etchant. Once the pattern has been fully formed by the action of the etchant in the revealed surface, the exposed resist can be removed with standard methods. As can be seen by the above description, such processes can be labor intensive and can be lengthy.

Further, certain photoresist compositions have serious drawbacks with respect to forming patterns in surfaces that are sensitive to water. Such surfaces can be water soluble or can be substantially hydrophilic and can swell or otherwise be partly dissolved or harmed by the presence of substantial quantities of water. Since some photoresist compositions can be water based and can be developed with a water spray, such resists cannot be used in conjunction with aqueous sensitive surfaces.

Still further, the use of many photoresist compositions on curved or contoured surfaces can pose serious problems. First, the transfer of a planar figure onto a curved surface by optical means can result in the substantial distortion of the shape or appearance of the figure. Such distortion can result in a ruined workpiece. Second, forming a uniform thickness of a liquid photoresist can be virtually impossible on such a surface. In the absence of uniform resist layers the pattern developed in the resist can often be incomplete, changed in shape or size, or can be otherwise distorted.

Accordingly, a substantial need exists for a photoresist that is easy to use, can readily develop an image or pattern and can be used on both water sensitive surfaces and surfaces having curves or contours.

BRIEF DISCUSSION OF THE INVENTION

I have found that a resist laminate article of manufacture comprising an adhesive layer, a membrane support layer and a resist layer can be used to introduce etched patterns into the surfaces of many objects of varying composition and shape. I have surprisingly found that the resist laminate can be adaptable to etching patterns in the surface of an object using processes having many variations of operative steps depending on the shape and compositional nature of the object to be etched.

A first aspect of the invention resides in a resist laminate that can have an adhesive layer, a membrane support layer means, and a photosensitive resist layer means. Preferably, the membrane supporting means is distinct from the resist layer. Most preferably, in the resist laminate, the resist layer is either held in contact between the adhesive layer and the support membrane or the support membrane is held in contact between the resist layer and the adhesive layer. The adhesive layer is always an external layer and can comprise a pressure sensitive adhesive having an optional release liner that protects the adhesive layer from the environment until used.

A second aspect of the invention is a method, in which the resist laminate of the invention is used to form a pattern on a surface of an object, comprising adhering the resist laminate to the surface of an object using an adhesive layer, exposing the resist laminate to electromagnetic radiation in a desired pattern, developing the exposed pattern in the resist to selectively reveal the pattern on either the object surface, on the adhesive layer or on the supporting membrane depending on the construction of the laminate, and etching the revealed pattern with a particulate etchant to form the desired pattern.

A third aspect of the invention relates to a method in which essentially planar patterns can be formed onto either a planar, a curved or a contoured surface, which method comprises exposing the resist laminate to the desired pattern of light, adhering the exposed but undeveloped resist laminate to the object surface using the adhesive layer, developing the resist laminate to selectively reveal the pattern on either the surface of the object, on the adhesive layer or on the supporting membrane depending on the construction of the laminate, and contacting the revealed surface with a particulate etchant. This method can be useful for transferring a planar pattern to a curved or contoured surface.

A fourth aspect of the invention relates to the use of the resist laminate to transfer patterns to a planar, a curved or a contoured surface. In this method a resist laminate is exposed to light, the pattern formed by the exposing light is developed in the resist laminate, the resist laminate is applied to the surface of the object leaving revealed portions of the surface of the object, and contacting the revealed portions with an etchant. This method can be useful on water sensitive surfaces since the surface is not contacted with water during the development or the etching process.

In each aspect of the invention, after etching is complete and the pattern is fully formed in the surface of the object, the resist laminate can be removed either mechanically or chemically from the surface of the object and any adhesive which remains is removed by gentle cleaning. Further, in each aspect, the support membrane can be a strippable, membrane which can be removed from the resist layer at any time. However the membrane is typically removed after the laminate is adhered to the object. By sandblasting we mean any high velocity abrasive particulate etchant.

DETAILED DISCUSSION OF THE INVENTION

Resist Layer

Figure 1:
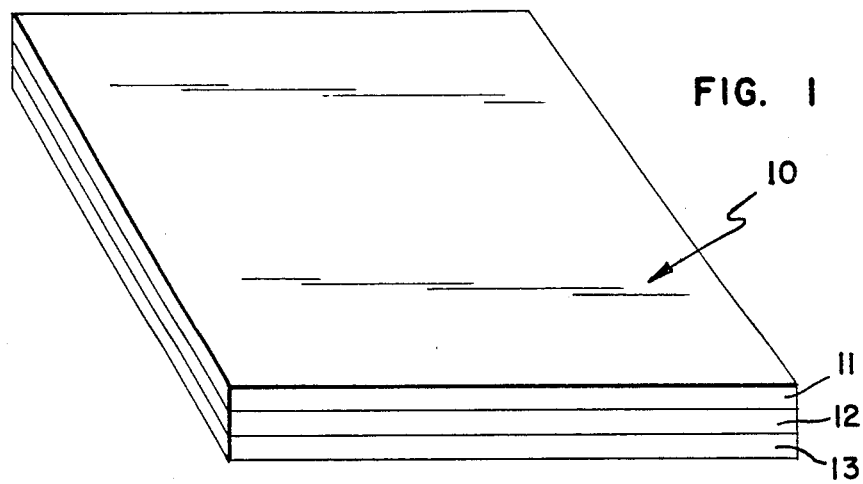
FIG. 1 is a view of a generally rectangular portion of a preferred resist laminate 10 of the invention which is made of a support membrane layer 12 held in contact between a resist composition layer 11 and an adhesive layer 13.

The resist laminate of the invention generally is made of a resist layer, a membrane support layer, and an adhesive layer.

The resist layer of the laminate generally comprises compositions that are photosensitive. The negative photo sensitive compositions typically interact with light to transform the composition from a soluble state into an insoluble film. Positive photoresist compositions are transformed from an insoluble state to a soluble state. Typically, resist compositions contain reactive monomeric and/or polymeric substances along with photo activated initiators.

In the preferred negative resist compositions, the substances in the resist can polymerize or crosslink when exposed to a sufficient quantity of electromagnetic radiation of an appropriate wave length to activate polymerization or crosslinking catalysts, agents, initiators or mixtures thereof. The electromagnetic radiation used to expose the composition typically is absorbed by the photo activated initiator, which initiates or participates in a polymerization or crosslinking reaction of the resist components. The photo initiated polymerization or crosslinking reaction typically renders the resist, where exposed, insoluble to the action of solvents such as water, alcohols, hexane, benzene, etc. The unexposed resist remains soluble and can be removed by the action of a solvent revealing the surface of an object to be etched. The insoluble exposed portion of the resist generally remains on the surface shielding it from the etchant during etching. In general any polymeric or monomeric system that can be insolubilized by light can be used in the invention.

Photo crosslinkable photoresist compositions can comprise a polymerizable or crosslinkable polymer composition, an insoluble polymeric film-forming binder composition, and a photo activated polymerization initiator or crosslinking agent. Optionally the compositions can contain other functional compounds such as surfactants, defoamers, dyes, antioxidants, perfumes, etc. Typically the crosslinked polymer forms an insoluble matrix which entraps the film-forming agent, creating the exposed resist layer.

Crosslinkable polymers can react with a crosslinker on separate polymer molecules resulting in the substantial insolubility of a crosslinked polymer mass. The crosslinking reaction results in an insoluble film which protects the surface of an object from the action of an etchant. In places where light does not contact the photo initiated crosslinker, the composition remains soluble, can be removed by the action of water or other effective solvent to reveal the surface for the action of an etchant.

The preferred crosslinkable polymer compositions comprise polymers having sufficient pendent hydroxyl groups to react with a sufficient concentration of the photo initiator crosslinking species. Such polymers can generically be considered homopolymers and copolymers of vinyl alcohol. Vinyl alcohol polymers are commonly made by polymerizing vinyl acetate and removing acetyl groups leaving pendent hydroxyls. In this way both homopolymers and copolymers can be made by polymerizing vinyl acetate with a variety of ethylenically unsaturated monomers to form a polymer and then saponifying the vinyl acetate groups leaving pendent hydroxyl groups. Suitable ethylenically unsaturated monomers, that can be polymerized with the vinyl acetate monomer to form vinyl alcohol copolymers, include olefins such as ethylene, propylene, acrylate and methacrylate monomers such as acrylic acid, methacrylic acid, methylmethacrylate, acrylamide, N,N-dimethylol acrylamide, styrene, maleic anhydride, vinyl chloride, and many others well known in the practice of polymer chemistry. Preferred photo crosslinkable polymers comprise homopolymers of vinyl alcohol.

Homopolymers of vinyl alcohol are characterized by molecular weight and degree of hydrolysis. The molecular weight of the polyvinyl alcohols typically range from about 2,000 to 100,000 number average molecular weight units. Commonly the molecular weight of commercial polyvinyl alcohol is reflected in the viscosity of a 4 wt-% solution measured in centipoise (cP) and 20° C. with a Brookfield viscometer. The viscosity of a 4% solution can range from about 5 to about 65 cP. The variation in film flexibility, water sensitivity, ease of solvation, viscosity, dispersing power can all be varied by adjusting the molecular weight or degree of hydrolysis of the polyvinyl alcohol. The preferred polyvinyl alcohol compositions for use in this invention comprise polyvinyl alcohol made with less than about 91% of the hydroxyl groups free of acetate. The preferred partially hydrolyzed polyvinyl alcohol is available in low, medium or high molecular variations. The low molecular weight polyvinyl alcohol has a viscosity of 4 to 10 cP, the medium molecular weight composition has a viscosity of 15 to 30 cP, and the higher molecular weight composition has a viscosity of about 35 to 60. Polyvinyl alcohol is made in the United States by Air Products and Chemicals, Inc. under the trade name VINOL ®, by duPont under the trade name ELVANOL ®, and by Monsanto under the trade name GELVATOL ®.

Another preferred resist comprises photoresist compositions made by forming polymers having pendent ethylenically unsaturated groups including polyvinyl cinnamate or polyvinyl crotonate, etc. polymers. The photoresist polymers can also be derived from natural or synthetic water soluble polymers such as gelatin, polyvinyl pyrrolidine, starch and others.

The photoresist compositions of the invention further contain a water insoluble film-forming polymeric binding agent. During the photo crosslinking of the composition the binding agent is entrapped in a mesh formed by the crosslinked mass. In this way the bulk binding agent adds to the insolubility and the film-forming potential of the photoresist composition. Typically, polymeric binding agents comprise insoluble polymers that can be formed into latices or stable suspensions of small particles of the polymer composition in a water medium. Such polymer suspensions are well known in the art and are available from a number of suppliers. Suitable binding agents for use in this invention include carboxymethyl cellulose, partially saponified cellulose acetate, water-insoluble hompolymers and copolymers made of comonomers such as styrene, methylmethacrylate, vinyl acetate, vinyl butyral, vinyl pyrrolidone, ethylene, propylene, alkylene oxide monomers, and maleic anhydride. The most preferred polymeric binding agent comprises polyvinyl acetate for reasons of its compatibility with polyvinyl alcohol polymers, economy and stability of its suspensions in aqueous media. Such polymer compositions are available from a variety of manufacturers including Air Products and Chemicals, Inc., W. R. Grace, Reichhold Chemicals, and others.

The formation of the insoluble film photoresist composition of this invention requires the presence of a light activated crosslinking agent or compound that can generate crosslinking species through the action of typically ultraviolet light. Preferred activating electromagnetic radiation is ultraviolet light with a wave length of about 250 to 450 nm at an intensity of 0.5 to 5 milliwatts cm$^{-2}$. Typical classes of photo initiators and crosslinkers include peroxides such as t-butyl peroxide, anthraquinones, benzoin alkyl ethers, and diazonium salts, etc.

A preferred class of photo initiated crosslinking compounds include diazonium salt photo crosslinking compounds. Diazonium salt crosslinkers when contacted by typically ultraviolet light yield one molecule of nitrogen per diazonium group and generate active crosslinking species. Suitable diazonium photo initiated crosslinkers include a paradiazodiphenylamine chloride-0.5 zinc chloride-formaldehyde condensate, paradiazodiphenylamine sulfate formaldehyde condensate, tetrazonium salts, etc. (see Tsunoda and Yamaoka, *J. Appl. Poly. Sci.*, Vol. 8, pp. 1379–1390 (1964)).

The crosslinkable resist compositions of the invention can also contain a plasticizer component. We have found that surprisingly high levels of plasticizer can provide a unique ability to the photoresist composition to increase resiliency and adhesion, to resist flaking and delamination of the resist laminate during use. A plasticizer content of about 0.01 to a maximum of 5 wt-% appears to be the conventional plasticizer content to increase the moldability of a plasticized composition. We have found that high levels of plasticizer provide surprising levels of properties not expected from the prior art. Further, we have found that the high levels of plasticizer used in the resist compositions of the invention provide a substantial resistance to mechanical shock experienced by the laminate during shipment and use.

The photoresist composition can contain virtually any plasticizer that is compatible with the photo crosslinkable polymer composition and the film-forming binder polymeric composition, in the aqueous suspension. Both monomeric and polymeric plasticizers can be used in the resist composition. Monomeric plasticizers are typically plasticizers comprising small molecules having a molecular weight of less than about 1,000. Polymeric plasticizers are typically polymeric compounds commonly with molecular weights greater than about 1,000. Typical monomeric plasticizers include dialkyl adipates, dialkyl azylates, dialkyl benzoates, dialkyl citrates, dialkyl derivatives of phthalic anhydride and isophthalic anhydride, alkyl sebacates, alkyl stearate, dialkyl terephthalate, trialkyl ester of trimetallic anhydride, etc. Polymeric plasticizers include the various polyglycols and derivatives thereof, epoxy derivatives of stearate esters or phthalate esters, polyester plasticizers such as SANTICIZER and PARAPLEX plasticizers. Preferred plasticizers for use in this invention comprise the dialkyl phthalate plasticizers which are preferred for reasons of compatibility, economy, and resulting elevated adherence and resiliency and resistance to shock, delamination and flaking. The most preferred plasticizers for use in this invention comprises a C$_{4-10}$ alkyl phthalate.

Optional compositions that can be used in the practice of this invention include surfactants which can be used to increase the compatibility of the aqueous resist composition with the surface of the object and to promote an even coating. A defoamer can be used to insure that the layer of resist is free of small bubbles and other foamed species. A dye can be used to permit visualization of the position and approximate thickness of the resist composition. An antioxidant can be used for the preservation of the concentrations of the crosslinking activator; and others.

Typically the aqueous photo crosslinkable resist composition contains about 0.1 to about 75 wt-%, preferably about 5 to 35 wt-%, of a photo crosslinkable or photo polymerizable composition, preferably a vinyl polymer having pendent hydroxyl groups; about 20 to 75 wt-%, preferably about 25 to 45 wt-%, of a film-forming polymeric binder; preferably a sufficient amount of a plasticizer to provide resiliency, flake resistance, increased adherence (delamination resistance), and shock resistance; about 0.01 to about 5 wt-% of the photo initiated crosslinking agent; and optionally about 0 to 1 wt-% of a surfactant, defoamer, dye, antioxidant, perfume or other functional substance. The amounts of plasticizer can vary and can be from about 5 to 25 wt-%, about 6 to 22.5%, about 7 to 20 wt-%, about 8 to 20 wt-%, about 9 to 20 wt-%, or about 10 to 20 wt-%.

The resist layer of the laminate article of this invention can contain an ethylenically unsaturated resist composition such as a cinnamate or crotonate containing vinyl polymer such as those found in Tsunoda, U.S. Pat. No. 4,118,233, or others as described by Ichimura, *J. Poly. Sci: Polymer Chem. Ed.*, Vol. 20, 1411–1417 and 1419–1432 (1982), which are expressly incorporated herein for their teaching of the ethylenically polymerized resist. The resist when exposed to light polymerizes to form an insoluble resist layer. Such composition can comprise a film-forming polymeric binder composition, a sensitizer composition which is typically ethylenically unsaturated; a liquid medium and a polymerization photo initiator. In the practice of the invention light falling on the photo initiator and the sensitizers causes the production typically of polymerizable species and free radical species which polymerizes ethylenically unsaturated compositions in the resist causing substantial polymerization and crosslinking trapping the insoluble polymeric binder composition in a network of polymer. Such polymerization results in the substantial insolubility of the areas struck by light.

Film-forming polymeric binder compositions useful in this invention are the same polymers and copolymers made from styrene, methylmethacrylate, vinyl acetate, vinyl butyral, maleic anhydride, ethylene, propylene, alkylene oxide monomers, vinyl pyrrolidone monomers, etc. disclosed above in the discussion of the crosslinkable resist compositions.

Sensitizers commonly used in the photo polymerizable resist compositions are monomers having photo sensitive ethylenically unsaturated groups such as vinyl acroyl, methacroyl, allyl, vinyl ether, acrylamide, etc. groups or prepolymers thereof having an average degree of unsaturation of about 1 to 5. Examples of sensitizers having a single ethylenically unsaturated group include acrylamide, acrylic acid, methacrylic acid, methyl methacrylate, and methylol acrylamide, etc. Preferred polyfunctional sensitizers have two or more photo sensitive ethylenically unsaturated groups including sensitizers such as pentaerythritol triacrylate, pentaerythritol tetraacrylate, pentaerythritol trimethacrylate, pentaerythritol tetramethacrylate, 2,2-dibromo methyl, 1,3-propane diacrylate, triallyl isocyanurate, N,N'-methylene bis-acrylamide, and prepolymers thereof. The most preferred sensitizer comprises pentaerythritol triacrylate. Polymerization reaction initiators suitable for use in the invention are those materials which will easily generate free radicals upon exposure to ultraviolet radiation. Examples of these initiators include benzoin-alkyl ethers, Michler's ketone, ditertiary butyl peroxide, dibenzothiazollyl-disulfide, dibromoacetophenone, anthroquinone, azobisisobutyronitrile, etc. In a similar fashion the ethylenically unsaturated resists of this invention can contain optional functional compounds such as defoamers, surfactants, dyes, antioxidants, perfumes, etc.

MEMBRANE SUPPORT LAYER

The membrane support layer of this invention commonly comprises a web, a film, or other such substrate which can be coated with either the resist composition of the invention, the adhesive composition of the invention, or both. The membrane layer must be mechanically strong to permit the rapid manufacture of the resist laminate but also can be removable before or after the development of the image or pattern in the resist layer or during exposure to the etchant composition. Preferred sheet-like membrane support layers can be about 0.1 to 10 mils and can be made from a variety of natural and synthetic materials including cellulose, paper, metal, polyolefins, polyester materials, polyvinyl chloride, spun bonded cellulosic or polymeric materials, etc. Preferred sheet-like materials for use in this invention are thin, less than 1 mil, mylar-polyethylene terephthalate polyester sheets. Such sheets are typically rapidly eroded in areas exposed by the resist by the action of the etchant.

ADHESIVE LAYER

The photoresist laminate of the invention comprises an adhesive layer that is used to adherently apply the laminate to the object for etching. The adhesive layer can be water activated, pressure sensitive, heat activated, or other adhesive form. The adhesive layer is preferably a pressure sensitive adhesive which is typically an adhesive composition having a high degree of tack and cohesive strength. Pressure sensitive adhesives tend to bond almost instantaneously to a surface with slight contact pressure at the interface between the adhesive and the contacted surface. In practice pressure sensitive adhesives commonly are used in conjunction with a pressure sensitive adhesive release liner comprising a backing material such as paper, textile, plastic film, or metal foil which has a generally silicone release coating to insure that a release liner can be removed from the pressure sensitive adhesive without reducing the adhesive properties of the adhesive mass and without any removal of the pressure sensitive adhesive. Pressure sensitive adhesives typically comprise a polymeric composition in combination with a tackifier and an extender composition which is typically applied to a substrate with either hot melt techniques or solution casting techniques. Typical base polymers include rubbers, styrene-elastomer-styrene block copolymers such as KRATON rubbers made by Shell, synthetic polymers such as polyvinyl acetate, or acrylate polymers. Typical tackifiers include polymeric materials made from natural products or synthetic monomers. A typical extending composition comprises oil. Such adhesive compositions are well known in the art.

Briefly, the resist laminate articles of manufacture of this invention are typically made by coating the membrane support with a resist composition. In one aspect of the invention the resist composition can be coated upon the membrane support layer using well known coating techniques. The adhesive layer can be coated on the opposite side of the membrane layer from the resist composition. Such coating steps can be done in tandem or simultaneously in production.

Alternatively, the resist layer can be coated on the support membrane and the adhesive composition can be coated upon a film of resist composition which rests upon the membrane support layer. A further alternative method of manufacturing the photoresist laminate of the invention comprises coating a support membrane with a photoresist material to form a film of the resist on the support membrane, separately coating a release liner sheet with a pressure sensitive adhesive composition to form a film of the pressure sensitive adhesive composition on the release liner, and contacting the uncoated side of the membrane support with the adhesive composition layer on the release liner to form the photoresist laminate comprising a resist layer, a support membrane layer, an adhesive layer, and the removable release liner.

METHODS OF USE

The photoresist laminate articles of manufacture of the invention are typically used by adhering the laminate to the surface of an object in order to produce an etched pattern on the surface of the object. Such etched pattern can be made using the laminate of the invention in a variety of methods resulting in a desirable image. Typically the laminate is applied to an object, exposed to a pattern of exposing radiation, developed to form a pattern resist, and the resist is then exposed to the action of a particulate etchant. Many variations of this basic etching process can be formed without departing from the spirit and scope of the invention since the steps can be rearranged to suit a particular resist laminate construction and object to be etched.

Figure 2:
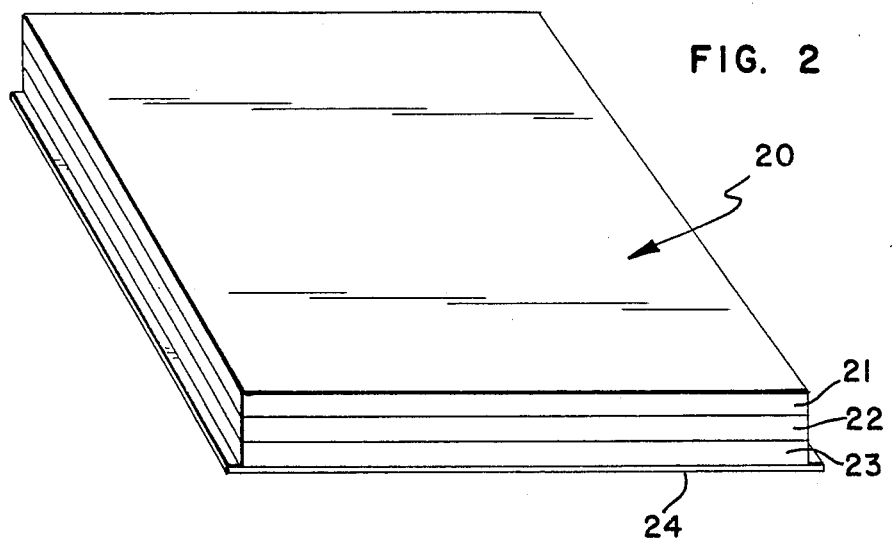
FIG. 2 is a view of a generally rectangular portion of a preferred resist laminate 20 of the invention which is made of a resist layer 22 held in contact between a support membrane layer 21 and an adhesive layer 23, which in turn has a release liner 24 in adherent contact with the side of the adhesive layer opposite the resist composition layer 22. The membrane 21 can be strippable leaving the resist layer 22 and the adhesive 23 on the object to be etched.

In FIG. 2 a diagram of a resist laminate 20 is shown comprising a support membrane 21, a resist layer 22, and an adhesive layer 23 with a removable release liner 24. The laminate 20 of FIG. 2 can be exposed through either the release liner 24 or through the support membrane 21 to the effects of activating electromagnetic radiation. The laminate 20 can be applied to the substrate object before or after such exposure. The support membrane 21 can be removable from the resist laminate and can be removed before or after attachment of the laminate to the object and also can be removed before or after exposure to radiation. The resist laminate 20 can be developed before or after application of the resist laminate to the substrate.

This broad outline can be implemented in a number of methods having different process steps. FIGS. 3-6 illustrate certain basic process steps of using the photoresist article of the invention. The basic process steps can be used in different order or sequence depending on the planar or curved nature or depending on the compositional nature of the surface of the object. The resist laminate of the invention can be used to accurately transfer a variety of patterns to curved or contoured surfaces or to surfaces that are sensitive to contact by aqueous systems.

Figure 3:
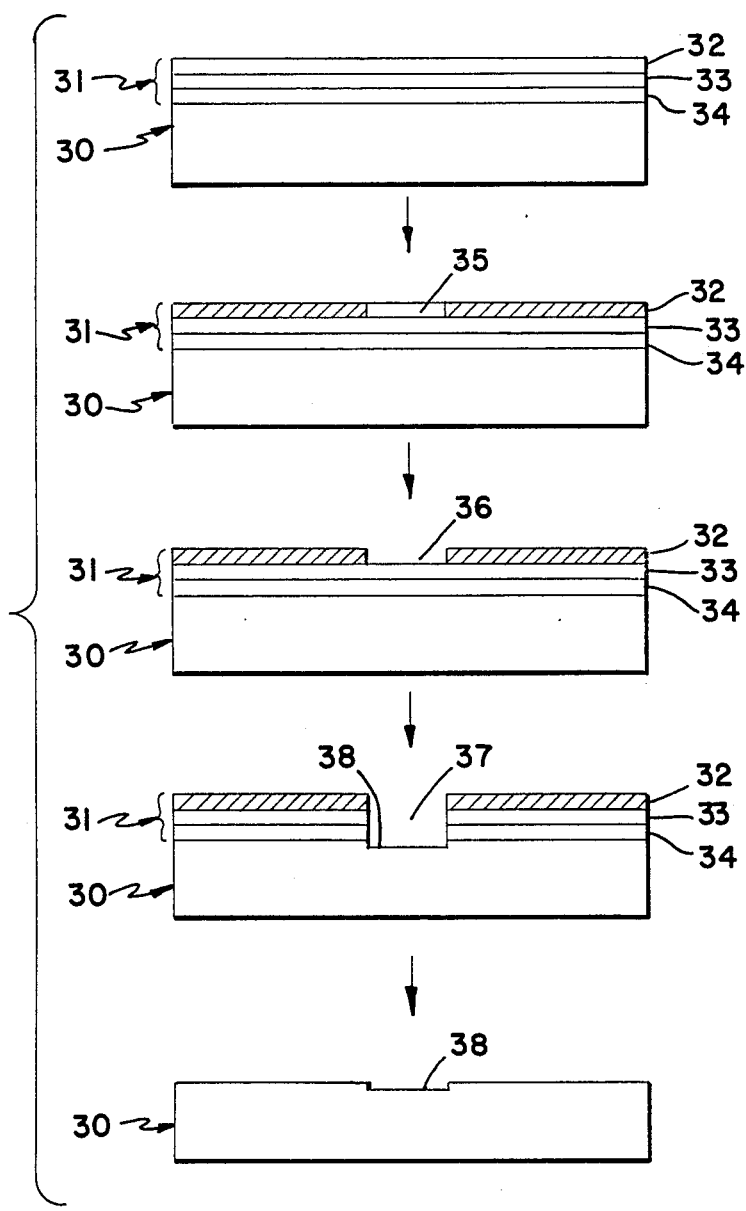
FIG. 3 is a diagram of a method of forming an etched pattern. An image 36 is formed in the resist layer on the surface of a flat, water resistant object 30 such as a stone monument using the steps of applying the resist laminate 31 having a resist layer 32, a membrane support layer 33 and an adhesive layer 34 to the monument 30, exposing the resist layer 32 to form a latent image 35 with a mask, revealing the image 36, and etching the resist and monument material to erode the membrane support and adhesive layers, leaving a deepened image 37 and finally, after removing the laminate, the etched pattern 38 in the surface.

FIG. 3 shows the use of the resist laminate 31 in forming a pattern in the surface of a large, essentially planar object 30. Typical objects include glass, stone, plastic, concrete, brick, metal, rubber, etc. surfaces. In use the photoresist laminate 31 can be directly applied to the essentially planar surface of the object 30. Alternatively the photoresist laminate composition having a release liner on the adhesive layer can be applied to the surface of the object by first removing the release liner and contacting the adhesive layer with the surface of the object. The essentially planar object 30 is shown in FIG. 3 with the resist laminate 31 applied to a portion of the object. The essentially planar object 30 has applied to it the photoresist laminate 31 comprising a resist layer 32, a membrane support layer 33 and an adhesive layer 34. In the process of exposing the resist to the effects of electromagnetic radiation, a photo mask in the desired shape is applied to the surface of the laminate 31 which can be exposed to the effects of electromagnetic radiation. Sufficient electromagnetic radiation is applied to the resist to cause the crosslinking or polymerization of the resist materials into an insoluble state. The mask is removed and the material not insolubilized by light is removed by a solvent which reveals a pattern 36 in the surface of the resist laminate. The pattern is exposed to the action of a sandblast, which rapidly erodes the support membrane and the adhesive layer leaving the exposed surface of the object 37 and after sufficient exposure to the etchant a pattern 38 is developed in the object surface.

Figure 4:
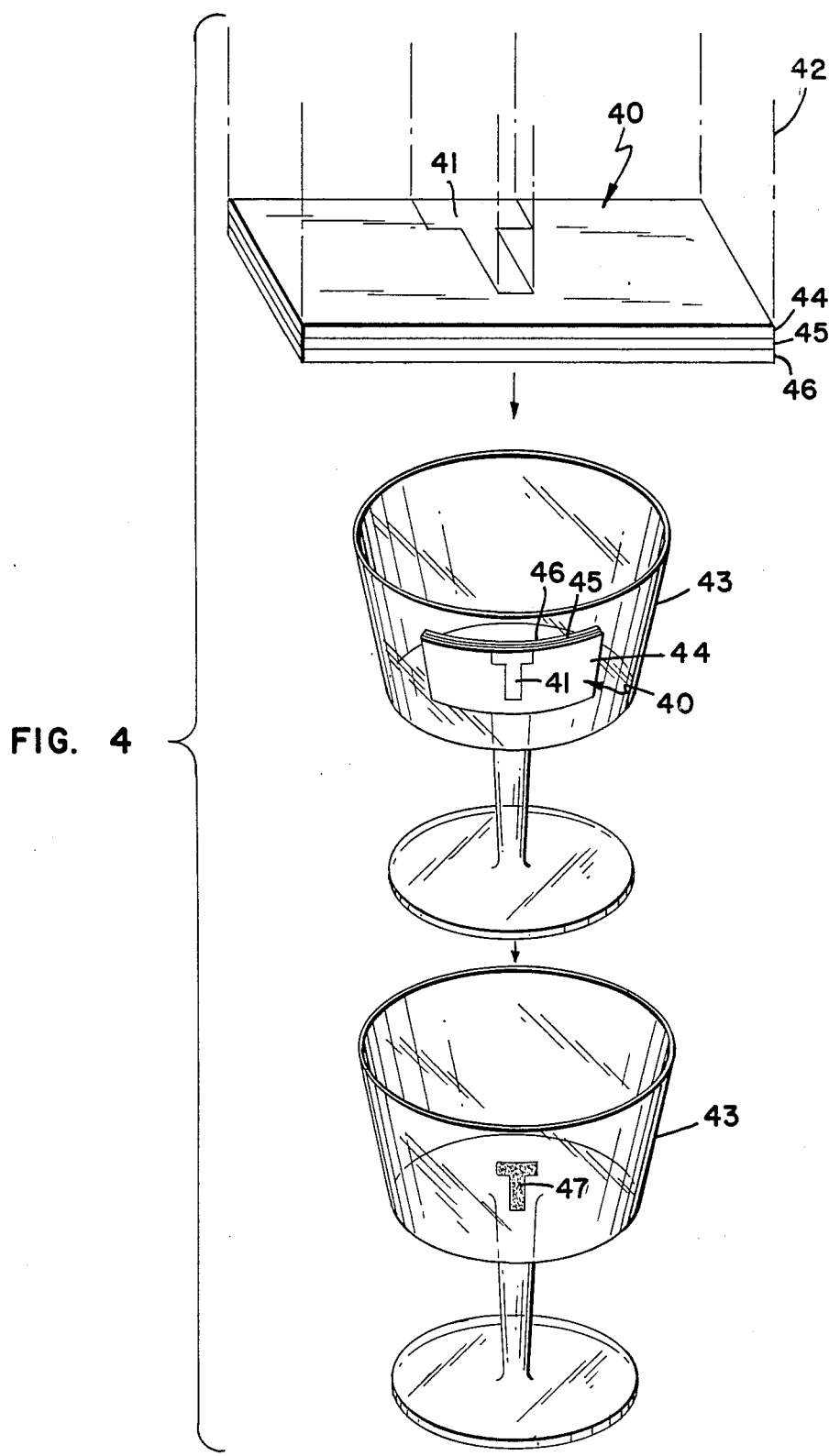
FIG. 4 is a diagram of a method of forming an etched pattern in the surface of a complex contour on an object such as a wine goblet 43. The photoresist laminate 40, comprising a resist layer 44, a support membrane 45 and an adhesive layer 46, is exposed with an ultraviolet light 42. The exposed laminate 40 is applied to the object 43, the soluble latent image 41 is developed, and the revealed support membrane 45 is etched, abrading the membrane and the underlying surface, leaving a desired pattern 47.

FIG. 4 is a diagram of a preferred mode of introducing an etched pattern into a curved or contoured surface. Since curved and contoured surfaces can distort the shape of essentially planar images when optically projected onto the surface, a process must be used which creates an image on the planar resist laminate prior to application of the resist laminate to the curved surface. Actinic radiation 42 is projected onto the resist laminate 40 selectively exposing the resist layer 44 leaving a soluble latent image 41. A latent image 41 is shown in the resist laminate 40 upon the curved object which is a wine goblet 43. After developing the support membrane covering the surface of the object is revealed in the appropriate pattern and is contacted with etchant, the etched pattern 47 is formed. In this way the latent image is formed into the resist laminate in a planar form prior to its application to the surface of the object where it can be developed without significant distortion and its pattern can be etched into the surface of the object.

Figure 5:
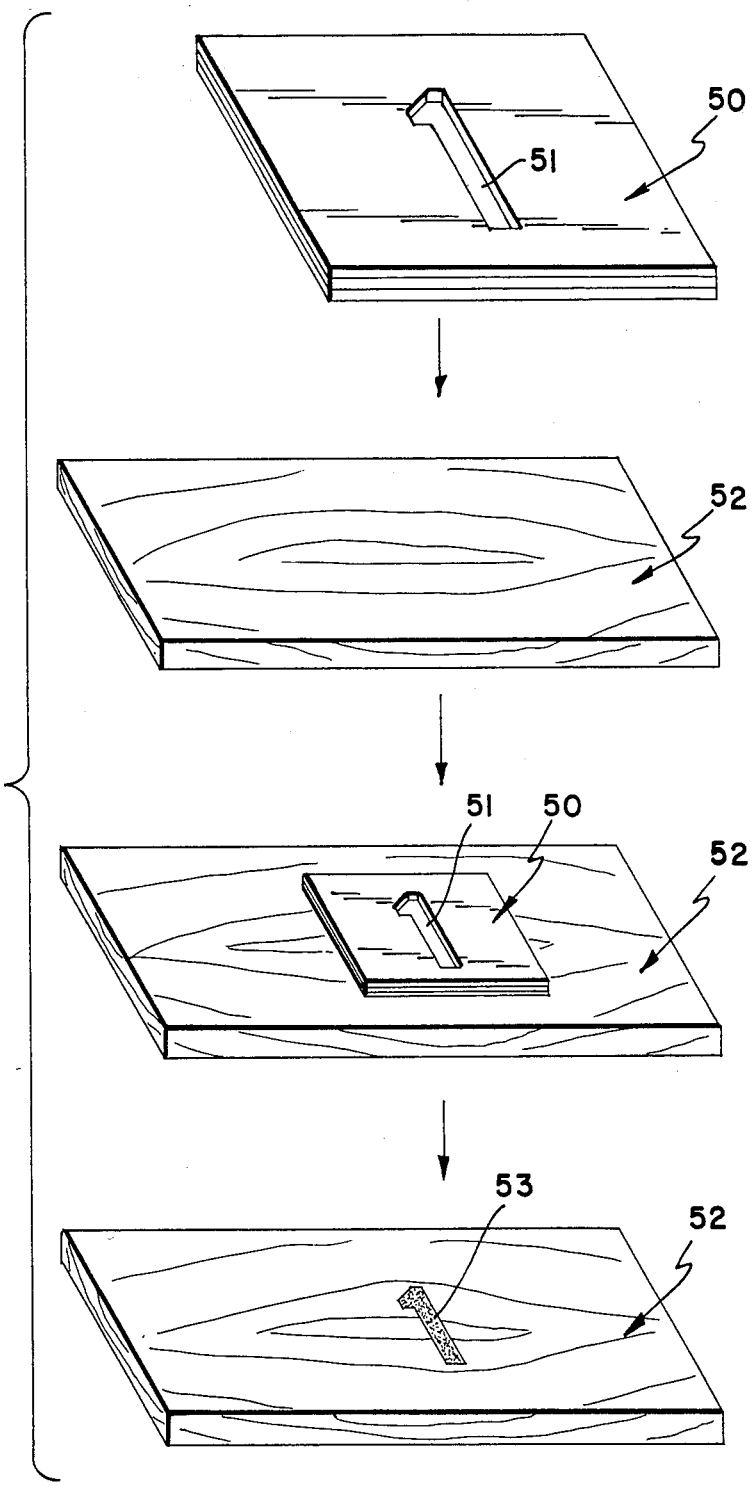
FIG. 5 is a diagram of a method of forming an etched pattern in a water sensitive substrate such as redwood. The resist 50 is exposed and developed, forming a revealed image 51. The resist with image 51 is applied to the wooden substrate 52, after which the wooden substrate is etched, and the remainder of the resist laminate is removed, leaving a pattern 53 in the revealed surface.

In FIG. 5 a method is shown in which the resist laminate of the invention can be used to produce a pattern in the surface of an object that is sensitive to the contact of moisture. Since the laminate does not contain any water it can be used on the sensitive substrate and since the laminate can be developed by aqueous solvents prior to its application to the substrate, the substrate does not come into contact with any significant portion of water. FIG. 5 shows a resist laminate 50 and an image 51 developed into the resist layer. The exposure and development can be done prior to application of the resist membrane to the surface of the object 52 to be etched. The redwood plank 52 shown in the Fig. is sensitive to the presence of water since water can cause it to swell or warp. The resist laminate 50 and image 51 are shown in contact with the redwood substrate and after contact with the etchant the pattern 53 is shown produced in the surface of the wooden member.

Figure 6:
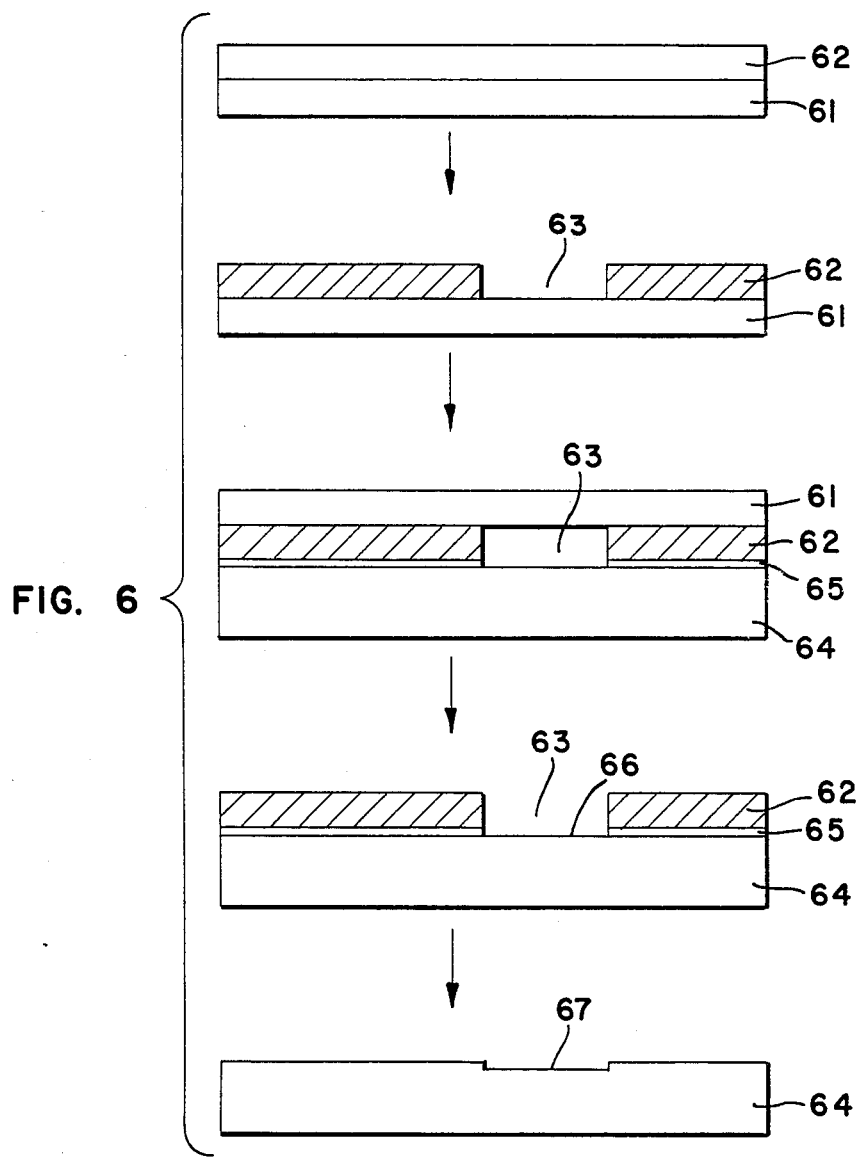
FIG. 6 shows a separate embodiment of a method of forming an etched pattern using the resist laminate of this invention. A laminate comprising the resist composition 62 and a support membrane 61 is masked, exposed and developed. The resulting resist with a revealed pattern 63 with a membrane support layer is applied to an object 64 using an adhesive layer 65. The support membrane 61 can be retained or removed, the revealed surface of the object is etched, and the remainder of the laminate is removed leaving the etched pattern 67 in the surface of the object 64.

FIG. 6 shows an alternative process for producing an image in the surface of an object. A resist laminate is shown having a support membrane 61, and a resist layer 62. The resist 62 is exposed and developed forming an image 63. A layer of adhesive 65 is applied to the developed resist and the laminate comprising membrane layer 61, resist layer 62 and adhesive layer 65 is applied to a substrate 64. The support membrane 61 can be removed if desired from the object leaving a portion of the surface of the object revealed to the action of an etchant. The etchant contacts the revealed surface 66 of the object 64 and results in the creation of an image 67 in the object 64.

The following Examples are provided to promote an understanding of the invention and contain a best mode.

EXAMPLE I

Onto a 3"×5" Mylar (polyethylene terephthalate) support membrane having a thickness of about 0.25 mil was placed a 5 mil film of the aqueous photoresist composition of the following formula:

| Ingredients | Wt-% |
| --- | --- |
| Poly(vinyl alcohol) - 25 wt-% solution of an 85-90% hydrolyzed polyvinyl acetate, molecular weight about 10,000 | 20.0 |
| Polyvinyl acetate - 50-55% emulsion of polymer solids in water, viscosity of 1800 cP, pH 4.0-6.0 and Tg of 40° C. | 63.0 |
| Di-n-butyl phthalate | 12.5 |
| Paradiazodiphenylamine sulfate - polymeric formaldehyde condensation product | 0.5 |
| Water | Balance |

The resist composition was dried and the uncoated side of the Mylar support layer film is brought into contact with a 3"×5" piece of release liner having a 1 mil coating of a polyvinyl acetate based hot melt pressure sensitive adhesive.

EXAMPLE II

Example I is repeated exactly except that the polyvinyl acetate is omitted and is replaced by a poly(ethylene-vinyl acetate) copolymer emulsion of 50-55% solids, a viscosity of 1300±200 cP, a pH of 5, and a Tg of −3° C.

EXAMPLE III

Example I is repeated exactly except that the polyvinyl acetate is omitted and is replaced by a poly(vinyl acetate-ethylene) copolymer emulsion of 50-55% solids, a viscosity of 1400-2000 cP, a pH of 4-6, and a Tg of 14° C.

EXAMPLE IV

Example I is repeated exactly except that the polyvinyl acetate homopolymer is omitted and is replaced with a polyvinyl acetate-dibutyl maleate copolymer emulsion of 55 wt-% solids, a viscosity of 6000 cP, a pH of 5 and a Tg of 15° C.

EXAMPLE V

Example I was repeated exactly except that the photoresist composition had the following formula:

| Ingredients | Wt-% |
| --- | --- |
| Poly(vinyl acetate) - homopolymer emulsion of 50-55 wt-% solids - viscosity of 1800 cP, pH 4.0-6.0 and Tg of 40° C. | 50 |
| Di-n-butyl phthalate | 10 |
| A 10% solution in water derivatized polyvinyl acetate having a DP = 500-1700 and 88% degree of hydrolysis which is substituted with N—methyl-4-(p-formyl styryl) pyridinium methosulfate to a level of about 2.5 mole-% of the quaternary salt to the monomer unit of poly(vinyl acetate) | 40 |

EXAMPLE VI

Example V is repeated exactly except that the polyvinyl acetate is omitted and is replaced by a poly(ethylene-vinyl acetate) copolymer emulsion of 50-55% solids, a viscosity of 1300±200 cP, a pH of 5, and a Tg of −3° C.

EXAMPLE VII

Example V is repeated exactly except that the polyvinyl acetate is omitted and is replaced by a poly(vinyl acetate-ethylene) copolymer emulsion of 50-55% solids, a viscosity of 1400-2000 cP, a pH of 4-6, and a Tg of 14° C.

EXAMPLE VIII

Example V is repeated exactly except that the polyvinyl acetate homopolymer is omitted and is replaced with a polyvinyl acetate-dibutyl maleate copolymer emulsion of 55 wt-% solids, a viscosity of 6000 cP, a pH of 5 and a Tg of 15° C.

EXAMPLE IX

Example I was repeated exactly except that the resist composition was replaced with the following resist composition.

| Ingredients | Wt-% |
| --- | --- |
| Poly(vinyl crotonate) - 40% solution in methanol water solvent of a copolymer of 40% saponified polyvinyl acetate substituted with a crotonic acid at a weight ratio of 97:3 - Corponeel PK-40 - Nippon Gosei Kagaku Kogyo KK | 57.2 |
| Pentaerythritol triacrylate | 11.8 |
| Benzoin methyl ether | 1.0 |
| Methanol | 11.8 |
| Di-n-butyl phthalate | 11.1 |
| Water | 7.1 |

EXAMPLE X

Example I was repeated exactly except that the resist composition was replaced with the following resist composition.

| Ingredients | Wt-% |
| --- | --- |
| Poly(vinyl crotonate) - 40% solution in 50 wt-% methanol-water solvent of a copolymer of 40% saponified polyvinyl acetate substituted with crotonic acid at a weight ratio of 97:3 - Corponeel TP-40 - Nippon Gosei | 15.4 |

| Ingredients | Wt-% |
| --- | --- |
| Kagaku Kogyo KK Pentaerythritol triacrylate | 3.2 |
| Benzoin methyl ether | 0.3 |
| Methanol | 11.1 |
| Polyvinyl acetate homopolymer emulsion 50–55 wt-% solids, pH 5, Tg 40° C. | 59.5 |
| Di-n-butyl phthalate | 10.5 |

EXAMPLE XI

Example X is reproduced exactly except that the polyvinyl acetate copolymer is omitted and is replaced with a poly(ethylene-vinyl acetate) copolymer emulsion of 50–55% solids, a viscosity of 1300±200 cP, a pH of 5 and a Tg of −3° C.

EXAMPLE XII

Example X is repeated except that the polyvinyl acetate homopolymer emulsion is omitted and is replaced with a poly(vinyl acetate-ethylene) copolymer emulsion of 50–55% solids, a viscosity 1400–2000 cP, a pH of 4–6 and a Tg of 14° C.

EXAMPLE XIII

Example X is repeated exactly except that the polyvinyl acetate homopolymer is omitted and is replaced with a poly(vinyl acetate-dibutyl maleate) copolymer emulsion of 55 wt-% solids, a viscosity of 6000 cP, a pH of 5.0 and a Tg of 15° C.

EXAMPLE XIV

Example I was repeated except that the resist composition of Example I was omitted and the following resist composition was substituted.

| Ingredient | Wt-% |
| --- | --- |
| Polyvinyl pyrrolidone, M.W. 40,000, 25 wt-% solution in water (GAF) | 20.0 |
| Polyvinyl acetate homopolymer emulsion, 50–55% solids, pH 5.0, Tg 40° C. | 63.0 |
| Dimethyl phthalate | 12.5 |
| Diazo diphenylamine sulfate, condensation product with formaldehyde | 0.5 |
| Water | 4.0 |

EXAMPLE XV

Example XIV is repeated exactly except that the polyvinyl pyrrolidone is omitted and is replaced with a polyvinyl pyrrolidone having molecular weight of 160,000.

EXAMPLE XVI

Example XIV is repeated exactly except that the polyvinyl pyrrolidone is omitted and is replaced with a polyvinyl pyrrolidone having molecular weight of 360,000.

EXAMPLE XVII

Example I is repeated exactly except that the dibutyl phthalate plasticizer was omitted and a dioctyl phthalate plasticizer was substituted therefor.

EXAMPLE XVIII

Example I is repeated exactly except that the di-n-butyl phthalate plasticizer is omitted and a butyl benzyl phthalate plasticizer is substituted therefor.

EXAMPLE XIX

Example II is repeated exactly except that the di-n-butyl phthalate plasticizer is omitted and a 2,2,4-trimethyl-1,3-pentane-diol diisobutyl butyrate plasticizer is substituted therefor.

EXAMPLE XX

Example III is repeated exactly except that the di-n-butyl phthalate plasticizer is omitted and sorbitol was substituted as a plasticizer therefor.

EXAMPLE XXI

Example V is repeated exactly except that the di-n-butyl phthalate plasticizer is omitted and glycerol is substituted therefor.

EXAMPLE XXII

Example V is repeated exactly except that the di-n-butyl phthalate plasticizer is replaced with a 50–50 by weight mixture of dioctyl phthalate and polyethylene glycol, molecular weight 200–800.

EXAMPLE XXIII

Example V is repeated except that the di-n-butyl phthalate plasticizer is replaced with a 50–50 by weight mixture of dibutyl benzyl phthalate and ethylene glycol.

EXAMPLE XXIV

Example IX is repeated exactly except that the dibutyl phthalate plasticizer is replaced with a mixture of 2,2,4-trimethyl-1,3-pentane diol diisobutyrate and polypropylene glycol molecular weight 200–800.

EXAMPLE XXV

Example IX is repeated exactly except that the dibutyl phthalate plasticizer is replaced with a mixture of propylene glycol and dioctylphthalate.

We have discovered that using the compositions of the above Examples, the photoresist laminates made therefrom have surprising and unusual properties that are different than those found in the prior art. We have found that the photoresist laminates produced using the compositions of this invention are flexible, have substantially higher adhesion to the support membranes, are more resilient and resistant to abrasion by contact with the particulate etchant, and are less likely to break and crack during use.

I claim:

1. A resist laminate for adherent application to the surface of an object, for exposure and development to reveal an image transferable to the surface by particulate etching, which consists essentially of:
   (a) a photoresist composition layer that is developable with aqueous media, the photoresist composition consisting essentially of:
      (i) about 0.1 to 75% by weight of a water soluble, photo sensitive vinyl polymer having pendent hydroxyl groups and being capable of photogenerated insolubility;
      (ii) about 20 to 75 wt-% of a polymeric film-forming binder;

(iii) an effective amount of a plasticizer sufficient to provide resiliency, flake resistance, delamination resistance, and shock resistance;
(iv) about 0.01 to 5% by weight of a photo crosslinking initiator composition effective to crosslink polymers having pendent hydroxyl groups; and
(v) about 0 to 1% by weight of a surfactant;
(b) a nonelastomeric support membrane; and
(c) an adhesive layer;
wherein each layer is held in substantially coextensive contact.

2. The laminate of claim 1 wherein the resist composition consists essentially of:
(a) about 5 to 35 wt-% of a polyvinyl alcohol polymer having an extent of hydrolysis of 85 to 90%;
(b) about 25 to 75 wt-% of a polyvinyl acetate polymer;
(c) about 5 to 25 wt-% of a dialkyl phthalate plasticizer;
(d) about 0.01 to 2% by weight of a diazonium salt photo initiator; and
(e) about 1% by weight of a surfactant.

3. The laminate of claim 1 wherein the plasticizer comprises di-n-butyl phthalate.

4. The laminate of claim 1 wherein the water soluble, photo sensitive vinyl polymer is a polyvinyl alcohol polymer.

5. The laminate of claim 1 wherein the water soluble, photo sensitive vinyl polymer is a polyvinyl pyrrolidone polymer.

6. The resist laminate of claim 1 wherein the photoresist composition layer is held in contact between the adhesive layer and the nonelastomeric support membrane.

7. A resist laminate for adherent application to the surface of an object, for exposure and development to reveal an image transferable to the surface by particulate etching, which consists essentially of:
(a) a photoresist composition layer that is developable with aqueous media;
(b) a nonelastomeric support membrane; and
(c) an adhesive layer;
wherein each layer is held in substantially coextensive contact and the support membrane layer is held in contact between the resist layer and the adhesive layer.

* * * * *